(12) United States Patent
Murillo

(10) Patent No.: US 6,961,891 B2
(45) Date of Patent: Nov. 1, 2005

(54) HIGH-EFFICIENCY ERROR DETECTION AND/OR CORRECTION CODE

(75) Inventor: Laurent Murillo, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 437 days.

(21) Appl. No.: 09/960,835

(22) Filed: Sep. 21, 2001

(65) Prior Publication Data

US 2002/0059552 A1 May 16, 2002

(30) Foreign Application Priority Data

Sep. 26, 2000 (FR) .............................. 00 12225

(51) Int. Cl.⁷ .............................................. H03M 13/13
(52) U.S. Cl. ...................................................... 714/763
(58) Field of Search .............................. 714/763, 757, 714/768, 772, 773, 767

(56) References Cited

U.S. PATENT DOCUMENTS

| | | | | |
|---|---|---|---|---|
| 4,030,067 A | * | 6/1977 | Howell et al. ............... | 714/758 |
| 4,107,652 A | * | 8/1978 | Tanahashi et al. ........... | 714/785 |
| 4,512,020 A | | 4/1985 | Krol et al. ..................... | 371/37 |
| 4,727,546 A | | 2/1988 | Van Gils ........................ | 371/37 |
| 5,563,894 A | | 10/1996 | Fujiwara et al. ............. | 371/37.1 |

FOREIGN PATENT DOCUMENTS

EP 0 629 051 A1 12/1994

OTHER PUBLICATIONS

Rao, T., et al., Error–Control Coding for Computer Systems, Prentice–Hall, 1989, pp. 247–252.*
Pyndiah, R.M., "Near–Optimum Decoding of Product Codes: Block Turbo Codes," *IEEE Transactions on Communications*, 46(8):1003–1009, Aug. 1998.
Blahut, R., "Theory and Practice of Error Control Codes," *Bose–Chaudhuri–hocquenghem Codes*, pp. 176–191, 1984.
Barel, C., "Etude d'un Code Correcteur d'Erreurs Pour un Systeme de Telemesure," *Public Presentation and Corresponding paper*, pp. 40–48, 1994.

* cited by examiner

Primary Examiner—Stephen M. Baker
(74) Attorney, Agent, or Firm—Lisa K. Jorgenson; Robert Iannucci; Seed IP Law Group PLLC

(57) ABSTRACT

A method for determining r error detection bits of a word of m bits to be coded, including the step of calculating the product of a vector with m components representative of said word of m bits to be coded and of a parity check matrix. The parity check matrix includes a pattern matrix that may be repeated in said parity check matrix, and said pattern being chosen so that a sum modulo 2 of any two columns of said sub-matrix does not give as a result another column of said sub-matrix. Another method determines a syndrome using r error detection bits determined by the above method.

16 Claims, 8 Drawing Sheets

FIG. 1A
(Prior Art)

$$H = \begin{pmatrix} 1 & 0 & 1 & 0 & 1 \\ 1 & 0 & 1 & 0 & 0 \\ 1 & 0 & 0 & 1 & 1 \\ 1 & 0 & 0 & 1 & 0 \\ 1 & 0 & 0 & 0 & 1 \\ 0 & 1 & 1 & 1 & 1 \\ 0 & 1 & 1 & 1 & 0 \\ 0 & 1 & 1 & 0 & 1 \\ 0 & 1 & 1 & 0 & 0 \\ 0 & 1 & 0 & 1 & 1 \\ 0 & 1 & 0 & 1 & 0 \\ 0 & 1 & 0 & 0 & 1 \\ 0 & 0 & 1 & 1 & 1 \\ 0 & 0 & 1 & 1 & 0 \\ 0 & 0 & 1 & 0 & 1 \\ 0 & 0 & 0 & 1 & 1 \end{pmatrix}$$

FIG. 1B
(Prior Art)

$$(X_0 \ X_1 \ \cdots \ X_{15}) = H * \begin{pmatrix} C_0 \\ C_1 \\ C_2 \\ C_3 \\ C_4 \end{pmatrix}$$

$$H = \begin{pmatrix} 0 & 0 & 0 & 0 & 1 \\ 0 & 0 & 0 & 1 & 0 \\ 0 & 0 & 1 & 0 & 0 \\ 0 & 1 & 0 & 0 & 0 \\ 1 & 0 & 0 & 0 & 0 \\ 1 & 0 & 1 & 0 & 1 \\ 1 & 0 & 1 & 0 & 0 \\ 1 & 0 & 0 & 1 & 1 \\ 1 & 0 & 0 & 1 & 0 \\ 0 & 1 & 0 & 0 & 1 \\ 0 & 1 & 1 & 1 & 0 \\ 0 & 1 & 1 & 1 & 0 \\ 0 & 1 & 1 & 0 & 1 \\ 0 & 1 & 0 & 1 & 0 \\ 0 & 1 & 0 & 1 & 1 \\ 0 & 1 & 0 & 1 & 0 \\ 0 & 0 & 1 & 1 & 1 \\ 0 & 0 & 1 & 0 & 1 \\ 0 & 0 & 1 & 0 & 1 \\ \end{pmatrix}$$

FIG. 2A
*(Prior Art)*

$$S = \begin{pmatrix} S_0 \\ S_1 \\ S_2 \\ S_3 \\ S_4 \end{pmatrix} = H^T * \begin{pmatrix} X_r \\ C_r \end{pmatrix}$$

FIG. 3C $$M2 = \begin{pmatrix} 0 & 1 & 1 & 1 & 1 \\ 0 & 1 & 1 & 1 & 0 \\ 0 & 1 & 1 & 0 & 1 \\ 0 & 1 & 1 & 0 & 0 \\ 1 & 1 & 0 & 1 & 1 \\ 1 & 1 & 0 & 1 & 0 \\ 1 & 1 & 0 & 0 & 1 \\ 1 & 1 & 0 & 0 & 0 \\ 0 & 0 & 1 & 1 & 1 \\ 0 & 0 & 1 & 1 & 0 \\ 0 & 0 & 1 & 0 & 1 \\ 0 & 0 & 1 & 0 & 0 \\ 1 & 0 & 0 & 1 & 1 \\ 1 & 0 & 0 & 1 & 0 \\ 1 & 0 & 0 & 0 & 1 \\ 1 & 0 & 0 & 0 & 0 \end{pmatrix}$$

FIG. 4A $$M1 = \begin{pmatrix} 1 & 0 & 1 & 1 & 1 \\ 1 & 0 & 1 & 1 & 0 \\ 1 & 0 & 1 & 0 & 1 \\ 1 & 0 & 1 & 0 & 0 \\ 1 & 1 & 0 & 1 & 1 \\ 1 & 1 & 0 & 1 & 0 \\ 1 & 1 & 0 & 0 & 1 \\ 1 & 1 & 0 & 0 & 0 \\ 0 & 0 & 1 & 1 & 1 \\ 0 & 0 & 1 & 1 & 0 \\ 0 & 0 & 1 & 0 & 1 \\ 0 & 0 & 1 & 0 & 0 \\ 0 & 1 & 0 & 1 & 1 \\ 0 & 1 & 0 & 1 & 0 \\ 0 & 1 & 0 & 0 & 1 \\ 0 & 1 & 0 & 0 & 0 \end{pmatrix}$$

| | | | | | | | | | | | | | | | |
|---|---|---|---|---|---|---|---|---|---|---|---|---|---|---|---|
| 0 | 0 | 0 | 1 | 1 | 1 | 0 | | 1 | 1 | 1 | 0 | | | | |
| 0 | 0 | 1 | 0 | 1 | 0 | 1 | | | | | | | | | |

*FIG. 5A*

FIG. 5B $$P2 = \begin{pmatrix} 0 & 0 & 1 & 1 & 1 & 1 \\ 0 & 1 & 1 & 1 & 1 & 0 \\ 1 & 0 & 1 & 1 & 0 & 1 \\ 1 & 1 & 1 & 1 & 0 & 0 \\ 0 & 0 & 1 & 0 & 1 & 1 \\ 0 & 1 & 1 & 0 & 1 & 0 \\ 1 & 0 & 1 & 0 & 0 & 1 \\ 1 & 1 & 1 & 0 & 0 & 0 \\ 0 & 0 & 0 & 1 & 1 & 1 \\ 0 & 1 & 0 & 1 & 1 & 0 \\ 1 & 0 & 0 & 1 & 0 & 1 \\ 1 & 1 & 0 & 1 & 0 & 0 \\ 0 & 1 & 0 & 0 & 1 & 1 \\ 1 & 1 & 0 & 0 & 1 & 0 \\ 1 & 1 & 0 & 0 & 0 & 1 \\ 1 & 0 & 0 & 0 & 1 & 1 \end{pmatrix}$$

*FIG. 6*

HIGH-EFFICIENCY ERROR DETECTION AND/OR CORRECTION CODE

BACKGROUND OF THE INVENTION

1. Field of the Invention

The present invention relates to error detection and/or correction codes, and in particular to linear codes of Hamming type.

2. Description of the Related Art

The Hamming code is an error detection and correction code used in many fields. Its use for transmission will be described, in the case where the data to be transmitted are in the form of 16-bit words.

Let X be the word to be transmitted. X can be represented by a vector Xe, the 16 components $X0, X1, \ldots X15$ of which correspond to the 16 bits of the word to be transmitted. Five error detection bits $C_i$ ($C_0 \ldots C_4$) are obtained by multiplying a parity check matrix H, called a Hamming matrix, of dimensions 5×16, by vector Xe in the form of a column vector.

FIG. 1A illustrates Hamming matrix H for 16 bits and FIG. 1B illustrates how to obtain the detection bits. Calling $h_{ij}$ the elements of matrix H, the error detection bits $C_i$ are given by:

$$C_i = \sum_{j=0}^{15} h_{ij} \cdot X_j$$

$X_j$ being the j-th component of vector Xe.

Upon transmission, 21-bit words, formed of the 16 data bits $X_j$ and of the 5 detection bits $C_i$ are sent. The received word includes 16 bits $X_r$ corresponding to the data bits and 5 bits $C_r$ corresponding to the detection bits. It is possible for $X_r$ and $C_r$ not to be equal to $X_j$ and $C_i$ if errors occur during transmission.

At the reception, a syndrome S with five components $S_0, \ldots S_4$ is calculated by multiplying a determined matrix H' of dimensions 5×21 by a column vector with 21 components, including the 16 bits $X_r$ and the 5 received bits $C_r$.

FIG. 2A illustrates matrix H'. The first 16 columns of matrix H' correspond to the 16 columns of matrix H. The 5 following columns each include a single "1". The 17-th column has its "1" on the first line, the 18-th column has its "1" on the second line, and so on until the 21rst column, which has its "1" on the fifth line. The last five columns of matrix H' are used to determine possible errors in the detection bits.

FIG. 2B illustrates the calculation of syndrome S.

If syndrome S has all its components equal to 0, the transmission occurs with no error and all the bits of the received word, be they data bits or detection bits, are correct.

If S is different from 0, the received word includes one or several errors. If a single bit of the received word is erroneous, the obtained syndrome enables correcting the error. Indeed, the obtained syndrome corresponds in this case to the column having has its elements multiplied by the erroneous bit. Thus, if the calculated syndrome is equal to $$S = \begin{pmatrix} 0 \\ 0 \\ 0 \\ 1 \\ 1 \end{pmatrix},$$

the components (00011) of the syndrome correspond to the elements of the first column of the Hamming matrix, which means that the first bit, $X_0$, is erroneous.

Similarly, if the calculated syndrome is equal to $$S'' = \begin{pmatrix} 1 \\ 0 \\ 0 \\ 0 \\ 0 \end{pmatrix},$$

and there is a single error in the received word, this means that the first detection bit $C_0$ is erroneous.

A disadvantage of the Hamming code is that it cannot detect two errors.

Thus, if an error has occurred on bits $X_1$ and $X_2$, the obtained syndrome is equal to the sum modulo 2 of the syndromes corresponding to errors on $X_1$ and $X_2$, that is, to: S'''=(00101)+(00110)=(00011). The obtained syndrome indicates an error on bit $X_0$, which is wrong.

Indeed, the Hamming code is known to have a minimum code distance d=3 and it is known that a linear code like the Hamming code is able to correct L errors and to detect L+1 errors if its minimum code distance d is strictly greater than 2L+1. Since d=3, L=0 and the Hamming code can only detect a single error with certainty.

Another disadvantage of the Hamming code is that the Hamming matrix is neither symmetrical nor regular. Indeed, it has been seen that syndromes with a single "1" are reserved to the control of the detection bits. Accordingly, these syndromes cannot be used to control the data bits and matrix H is constructed by using the remaining bit configurations. For the first column, the first possible configuration is (00011). For the second column, the next possible configuration is (00101), etc. Considering that the elements of a column correspond to the binary representation of a number, the variation of this number is not regular and includes jumps. Such jumps make difficult the forming of a circuit implementing the Hamming code as well as the syndrome decoding, that is, the determination of the erroneous bit.

SUMMARY OF THE INVENTION

An embodiment of the present invention provides a method for implementing a more efficient error detection and/or correction code than the Hamming code.

The method implements an error detection and/or correction code that can be implemented in a simple way by an integrated circuit.

The method implements an error detection and/or correction code that enables easy decoding.

The method determines r error detection bits of a word of m bits to be codedand includes the step of calculating the product of a vector with m components representative of said word of m bits to be coded and of a parity check matrix. The parity check matrix includes one or more pattern matrixes chosen so that a sum modulo 2 of any two columns of said pattern matrix does not give as a result another column of said pattern matrix.

According to an embodiment of the present invention, the pattern matrix is a matrix G such that:

$$G = \begin{pmatrix} 11110000 \\ 00001111 \\ 00110011 \\ 01010101 \end{pmatrix}$$

According to an embodiment of the present invention, m is a multiple of 8 and the sub-matrix is present m/8 times in the parity check matrix.

According to an embodiment of the present invention, the parity check matrix includes a plurality of pattern matrixes and the elements of the pattern matrix represent the lower elements of the columns of the parity check matrix. The elements of the upper lines of the parity check matrix, if they exist, are such that: on the line immediately above the pattern matrixes, "0s" are present on the pattern matrixes of even rank and "1s" are present on the patterns matrixes of odd rank; on the next upper line, "0s" are present on the first two pattern matrixes, "1s" are present on the next two pattern matrixes, and so on; and, more generally, on the n-th line above the pattern matrixes, "0s" are present on the first $2^{n-1}$ pattern matrixes, "1s" are present on the next $2^{n-1}$ sub-matrixes, etc, so that the number formed by the binary representation of the elements located above any column of a sub-matrix indicates the position of the considered sub-matrix in the parity check matrix.

According to an embodiment of the present invention, the upper line of the sub-matrixes is displaced to form the first line of the parity check matrix, whereby the last elements of any column of the parity check matrix are the binary representation of the position of said column.

According to an embodiment of the present invention, the pattern matrix is a first sub-matrix G' such that:

$$G' = \begin{pmatrix} \bar{g}\bar{g}gg \\ gg\bar{g}\bar{g} \\ \bar{g}g\bar{g}g \\ g\bar{g}g\bar{g} \end{pmatrix},$$

g being a binary element and $\bar{g}$ being its complement.

According to an embodiment of the present invention, m is a multiple of 4, the first sub-matrix being present [(m/4)−1] times, and the first four columns of the parity check matrix including the elements of a second sub-matrix G'0 such that:

$$G'0 = \begin{pmatrix} 0111 \\ 1011 \\ 1100 \\ 1110 \end{pmatrix}.$$

According to an embodiment of the present invention, the elements of the first and second sub-matrixes represent the lower elements of the columns of the parity check matrix. The elements of the upper lines of the parity check matrix are such that: on the line immediately above the sub-matrixes, "0" are present on said second sub-matrix and said first sub-matrixes of even rank, and "1s" are present on said sub-matrixes of odd rank; the next upper lines, when they exist, being such that: on the n-th upper line above the sub-matrixes, "0s" are present on the sub-matrixes of rank 0 to $[2^{(n-1)}-1]$, "1s" are present on the $2^{n-1}$ next sub-matrixes, and so on, so that the number formed by the binary representation of the elements located above any column of a sub-matrix indicates the position of the considered sub-matrix in the parity check matrix.

According to an embodiment of the present invention, the location of the columns of the second sub-matrix is modified so that, after modification, the column of rank 0 of the second sub-matrix is at rank 1, its column of rank 1 is at rank 3, its column of rank 3 is at rank 0, its column of rank 2 remaining at rank 2; the second line of the sub-matrixes, that is, the third line before the end of the parity check matrix, is displaced to form the first line of the parity check matrix, and the last line of the parity check matrix is displaced to form the second line of the parity check matrix, so that the lower elements of any column of the parity check matrix are the binary representation of the position of said column, except for the first column.

The present invention also relates to a method for determining a syndrome representative of possible errors that have occurred, during a processing, to a word of m+r+1 bits, the m+r+1 bits corresponding, before processing, to m bits of a word to be coded, r error detection bits obtained by a method according to the present invention applied to the m-bit word to be coded, and 1 parity bit obtained by calculating the sum modulo 2 of said r error detection bits, the syndrome being obtained in a step of multiplying a specific matrix by a vector having m+r+1 components representative of said m+r+1-bit word. The specific matrix includes:

a) for the elements of the first r lines and the first m columns, the elements of the parity check matrix having been used to determine the r error detection bits, b) for the last line, "0s" for the first m columns and "1s" after, c) for the first r lines and columns m+1 to m+r, a single "1" per column, shifted from line to line, the block formed by the first r lines and columns m+1 to m+r being in the form of a diagonal matrix, and d) for the last column, "0s" everywhere except on the last line.

The present invention also relates to a method for determining a syndrome representative of possible errors that have occurred, during a processing, to a word of m+r+2 bits, the m+r+2 bits corresponding, before processing, to m bits of a word to be coded, r error detection bits obtained by a method according to the present invention applied to the m-bit word to be coded, and first and second parity bits, the first parity bit being obtained by calculating the sum modulo 2 of said r error detection bits and the second parity bit being obtained by calculating the sum modulo 2 of said m bits of the word to be coded, of the r error detection bits, and of the first parity bit, the syndrome being obtained in a step of multiplying a specific matrix by a vector having m+r+2 components representative of said m+r+2-bit word. The specific matrix includes:

a) for the elements of the first r lines and the first m columns, the elements of the parity check matrix having been used to determine the r error detection bits, b) for the next to last line, "0s" for the first m columns, "1s" for columns m+1 to m+r+1, and a "0" for the last column, c) for the last line, "1s" for all columns, d) for the first r lines and columns m+1 to m+r, a single "1" per column, shifted from line to line, the block formed by the first r lines and columns m+1 to m+r being in the form of a diagonal matrix, e) for the next to last columns, "0s" on the first r lines and "1s" on the last two lines, and f) for the last column, "0s" everywhere except on the last line.

The foregoing objects, features and advantages of the present invention will be discussed in detail in the following non-limiting description of specific embodiments in connection with the accompanying drawings.

BRIEF DESCRIPTION OF THE DRAWINGS

FIGS. 1A and 1B, previously described, respectively show a Hamming matrix H and how to obtain detection bits to code a 16-bit word;

FIGS. 2A and 2B, previously described, respectively show a Hamming matrix H' for calculating a syndrome and the syndrome calculation mode for a 16-bit word;

FIGS. 3A and 3B respectively illustrate a parity check matrix M1 usable in a first embodiment of the present invention and an associated matrix M'1 for calculating a syndrome;

FIG. 3C illustrates an alternative of the matrix of FIG. 3B;

FIG. 4A and 4B respectively illustrate an alternative of the parity check matrix of FIG. 3A and the way of constructing it;

FIGS. 5A and 5B respectively illustrate a parity check matrix P1 usable in a second embodiment of the present invention and an associated matrix P'1 for calculating a syndrome; and FIG. 6 illustrates an alternative of the matrix of FIG. 5A.

DETAILED DESCRIPTION OF THE INVENTION

Figures 3A, 3B:
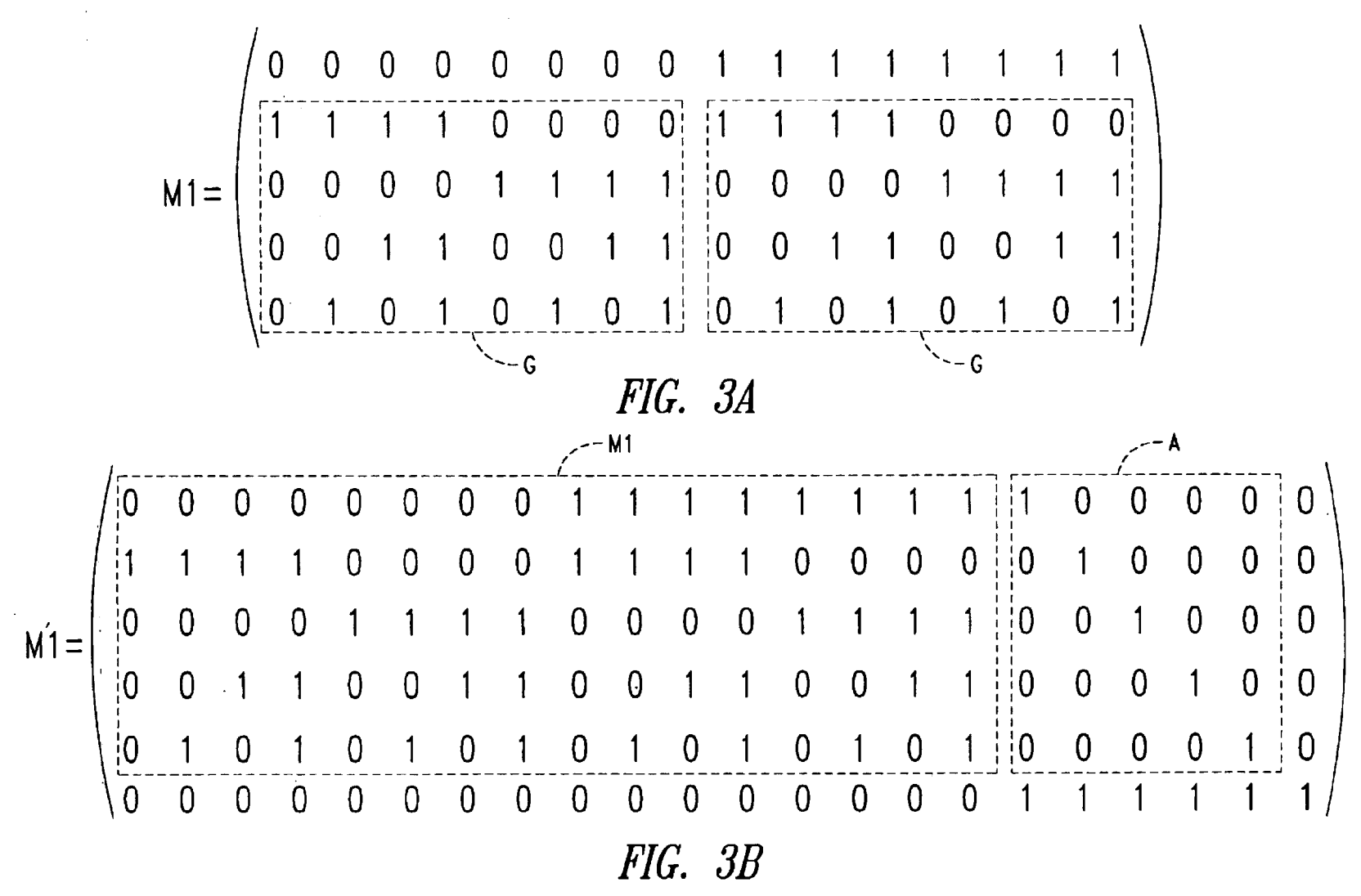

FIG. 3A illustrates a parity check matrix M1 used to calculate detection bits in a first embodiment of the present invention.

Matrix M1 is a 5×16 matrix. It is intended for being multiplied by a vector representative of a 16-bit word to be coded to provide 5 error detection bits $C_i$. Matrix M1 is formed based on a repetitive pattern. The repetitive pattern is represented by a matrix G of dimensions 4×8 and is repeated twice. Matrix G is equal to:

$$G = \begin{pmatrix} 11110000 \\ 00001111 \\ 00110011 \\ 01010101 \end{pmatrix}.$$

Matrix G is chosen so that each column of matrix G is different from another column of matrix G and, if any two columns of matrix G are added modulo 2, this provides no other column of matrix G. Thus, the logic addition of the second and third columns of matrix G provides (1001)⊕(1010)=(0011) [symbol ⊕ designates the XOR operation], which corresponds to no column of G. This is done to be able to detect two errors, as will be seen hereafter.

The two matrixes G, which form sub-matrixes of matrix M1, are placed side by side and occupy the last four lines of matrix M1. The first line of matrix M1 is chosen to be able to discriminate the two matrixes G, and "0s" are placed above the columns of the first matrix G and "1s" are placed above the columns of the second matrix G.

It should be noted that, due to the fact that no addition modulo 2 of two columns of matrix G provides another column of this matrix, the addition of any two columns of matrix M1 does not provide a column of matrix M1, which is an advantage as compared to the Hamming matrix.

By multiplying matrix M1 by the column vector representative of the word to be coded, 5 detection bits $C_0$ to $C_4$, designated by $C_i$, are obtained.

According to an embodiment of the present invention, a parity bit P is further determined by the following relation:

$$P = C_0 \oplus C_1 \oplus C_2 \oplus C_3 \oplus C_4.$$

Parity bit P is added to the word to be coded, in addition to the 5 detection bits. The coded word thus includes the 16 bits of the initial word, 5 detection bits and parity bit P, that is, 22 bits.

To calculate the syndrome of a word coded after processing, for example after transmission or storage, the word coded after processing is multiplied by a matrix M'1.

FIG. 3B illustrates matrix M'1.

Matrix M'1 is a 6×22 matrix. It first includes matrix M1, arranged at the top left, that is, the elements of the first 5 lines and first 16 columns of matrix M' correspond to the elements of matrix M1. Under matrix M1, there are only "0s", that is, the coefficient located on the sixth line of columns 1 to 16 is always equal to "0".

Columns 17 to 21 of matrix M'1 are formed as follows. The first 5 lines of columns 17 to 21 form a block A which corresponds to the 5 last columns of matrix H'. Block A thus has "0s" everywhere except on its diagonal, which includes "1s". Under block A, there are only "1s". The last and twenty-second column of matrix M'1 includes "0s" on the first five lines and a "1" on the last line.

Thus, the last line of matrix M'1 includes only "0s" for the first 16 columns and "1s" for columns 17 to 22. This last line enables distinguishing an error having occurred on a data bit on the one hand, and on a detection bit or on the parity bit on the other hand.

As compared to the Hamming coding, matrix M'1 includes one more line and one more column than matrix H'. The calculated syndrome includes one more component than in the Hamming case. The relative complexity that results therefrom matters little as compared to the provided advantages.

Thus, due to the fact that the sum modulo 2 of any two columns of the pattern of matrix M1 provides no other column of the pattern of this matrix, the error detection is better than in the case of the Hamming coding.

Consider, for example, the case examined in the preamble, where the word to be decoded includes both an error on bit $X_1$ and an error on bit $X_2$. With the provided coding, the obtained syndrome is equal to (010010)⊕(010100)=(000110). This syndrome is not one of the syndromes indicating a bit error. Accordingly, the provided coding here enables detection of two errors whereas, as it should be reminded, the Hamming coding would indicate in this case an error on bit $X_0$.

However, each time there is a single "1" in a syndrome, the provided coding cannot detect two errors. Thus, the provided coding cannot detect errors existing on both $C_1$ and P, since the obtained syndrome (010000) indicates an error on $X_0$. Also, errors on both $C_2$ and P will provide syndrome S=(001000), corresponding to an error on bit $X_4$. This case only occurs twice.

Also, each time there are only two "1s" in a syndrome, the provided coding cannot detect two errors. For example, if there is an error on $C_1$ and $C_4$, syndrome S=(010010) is obtained, which corresponds to an error on $X_1$.

In the provided coding, as in the Hamming code, a single error is 100% detectable and 100% correctable. The probability P of detecting two errors is the following. For 16-bit words, there are, for the data bits, 8 possible syndromes where the detection of two errors is not possible. These 8 syndromes correspond to the two syndromes where there is a single "1" in the syndrome, and to 6 syndromes where there are two "1s" in the syndrome. One has:

$$P=1-[3\times8\times2/(22\times21)]=0.8961,$$

in which product (22×21)/2 represents all the possible configurations of two errors and factor 3 is the number of configurations of two undetectable errors for a syndrome where the detection of two errors in not possible.

Accordingly, the provided coding enables, for 16-bit words, detection of two errors in 89.61% of the cases.

In practice, the words to be coded are much longer, and the probability of determining two errors is all the greater. For example, for 128-bit words, the probability of detecting two errors is equal to:

$$P=1-[3\times14\times2/(137\times136)]=0.9955$$

137 being the sum of the number of data bits (128), of the number of detection bits (8, in this case), and of parity bit P.

The advantage of the provided coding with respect to the Hamming coding thus is very clear. On the one hand, the percentage of detection of two errors is greater (with the Hamming code, P=0.2857 and P=0.1166, respectively, for 16-bit words and 128-bit words) and, on the other hand, the presence of symmetries in M1, well visible by scanning the lines of M1, enables using coding and decoding circuits which are easy to make to determine the detection bits.

It is further possible to advantageously modify the coding used in the first embodiment of the present invention.

A first alternative of the first embodiment of the present invention enables achieving a 100% probability of detecting two errors. In this alternative, the coded word is formed of 23 bits. The first 22 bits of the coded word correspond to the 22 bits of the previously-defined coded word, that is, the 16 bits of the word to be coded, 5 detection bits obtained by multiplying matrix M1 by a column vector representative of the word to be coded, and a parity bit P equal to the sum modulo 2 of the detection bits. The last bit is another parity bit $P_T$, obtained by calculating the sum modulo 2 of the 22 preceding bits. To calculate the syndrome of such a word after processing, a vector representative of the word coded after processing is multiplied by a matrix M"1.

Figure 3C:
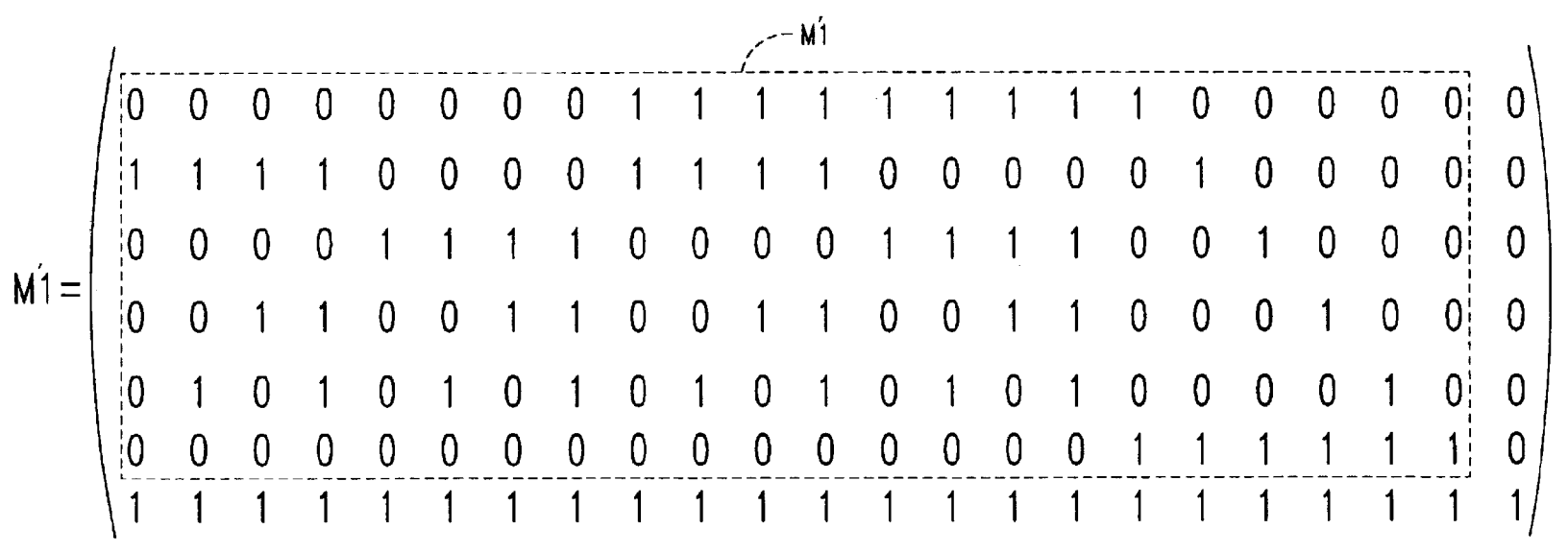

FIG. 3C illustrates matrix M"1. Matrix M"1 is a matrix of dimensions 7×23. Matrix M"1 is formed based on matrix M', arranged at the top left, that is, the elements of the first 6 lines and of the first 22 columns of matrix M"1 correspond to the elements of matrix M'1. The last line of matrix M"1 only includes "1s", and the last column of matrix M"1 includes "0s" on all lines, except on the last one.

In this alternative, two errors are always detected and translate as a "0" on the last component of the syndrome. The code so modified thus enables, in addition to the detection and correction of one error in 100% of the cases, detection of two errors also in 100% of the cases. The minimum code distance then is equal to 4, which is a considerable advantage, for example in terms of data storage in a memory. This code can thus be designated by initials SEC-DED ("Single Error Correction-Double Error Correction").

A second alternative of the first embodiment of the present invention enables making the decoding easier. In this alternative, a matrix M2 is used for the coding.

FIG. 4A illustrates matrix M2. To form matrix M2, matrix M1 is first taken. Then, as illustrated in FIG. 4B, the second line of matrix M1 is taken and put in the first position. The first line of matrix M2 so obtained thus corresponds to the second line of matrix M1 and its second line corresponds to the first line of M1. This is perfectly possible, since only the order of the detection bits will be modified.

For the decoding, a matrix M'2 (not shown) is formed on the model of matrix M'1, that is, matrix M' includes matrix M2 to the top left, the rest of the coefficients corresponding to those of matrix M'.

The use of matrix M2 enables easier decoding of the syndromes. Indeed, the last four elements of each column of matrix M2 form the binary representation of successive numbers which correspond to the position or rank of the considered column, the first column of matrix M2 being at position "0". Accordingly, if the data bit is erroneous, the components of the obtained syndrome include the binary representation of the position of the erroneous bit (the first bit, $X_0$, is at position "0") and the error correction will be eased. As an example, the last four elements of the seventh column (in position 6) are "0110", which is a binary representation of "6". An error on bit $X_6$ thus translates as syndrome S=(001100), the last components of which, after elimination of the final "0", which indicates an error in a data bit, are the binary representation of "6", which indicates the position of the erroneous bit.

Further, the preceding advantage may be combined with a probability of detecting two errors equal to 100% by using a matrix M"2 (not shown) constructed based on matrix M'2 on the model of matrix M"1, that is, the last line of matrix M"2 includes only "1s" and its last column includes only "0s", except on the last line. In this case, the coded words are 23-bit words, that is, 16 data bits, followed by 5 detection bits, themselves followed by a first parity bit P equal to the sum modulo 2 of the 5 error detection bits and of a second parity bit $P_T$ equal to the sum modulo 2 of the 22 preceding bits.

Of course, the coding described in relation with FIGS. 3A to 4B may be generalized for coding words of more than 16 bits.

To construct a parity check matrix M1m (not shown) intended for determining parity bits $C_0$ to $C_{r-1}$ of m-bit words to be coded, the number of times that matrix G must be repeated is first defined. If m is a multiple of 8, matrix G is repeated a number k of times equal to: k=m/8. The successive matrixes G are placed one after the other and occupy the last four lines of matrix M1m.

Matrix M1m is of dimensions r×m. r is the number of detection bits necessary to code the word to be coded.

The upper lines of matrix M1m are formed to be able to discriminate the different matrixes G. Thus, the first line above matrixes G includes "0s" above the matrixes G of even rank (the first matrix is considered as being in position "0"; its rank "0" is even) and "1s" above the matrixes G of odd rank. The next line includes "0s" on the two first matrixes G, "1s" on the next two lines, then "0s" again on the next two, and so on. If it exists, the third line above matrixes G includes "0s" on the first four matrixes G, "1s" on the next four matrixes G, and so on. The next lines, if they exist, are formed in a similar way by first grouping matrixes G by 8, then by 16, etc. Thereby, the elements above any matrix G are the same for all the columns of the considered matrix G and correspond to the binary representation of the position of the considered matrix G. Thus, "0 . . . 000" is found above each column of the first matrix G, "0 . . . 001" is found above each column of the second matrix G, etc.

The corresponding matrix M'1m (not shown) is established according to the principles described in relation with matrix M'1. Matrix M'1m thus includes the elements of matrix M1m to the top left, "0s" under these, a square block of dimensions $r^2$ in the form of a diagonal matrix with "1s" on the diagonal, a last line with "0s" under matrix M1m and "1s" under the square block, and a last column with "0s" everywhere except on the last line, where a "1" is to be found.

The obtained matrixes M1m and M'1m provide the advantages of matrixes M1 and M'1, that is, they exhibit many symmetries easing the forming of circuits implementing the provided coding.

Further, a matrix M2m (not shown), formed on the model of matrix M2, will ease the decoding, the last r-1 elements of each column corresponding to the binary representation of the position of the considered column.

There are two possible ways of forming M2m.

It is first possible, based on previously-described matrix M1m, to displace the fourth line from the bottom of matrix M1m (which corresponds to the first line of matrixes G) to put it as a first line, lines 1 to r-4 being each shifted downwards by one rank. In the matrix M2m so obtained, coefficients 2 to r of each column are the binary representation of the column position.

Matrix M2m may also be formed directly by noting that the elements of the first line of M2m are the inverses, or complements to 1, of the elements of the third line before the end (second line of matrixes G). Accordingly, each column of matrix M2m can be formed by taking for r-1 lower elements the binary representation of the column position and as a first element the inverse of the last element but two.

For the decoding, a matrix M'2m, constructed based on matrix M2m on the model of matrixes M', M', or M'1m, will be used.

It should be noted that, if it is desired to be able to detect two errors in 100% of the cases, coded words of m+r+2 bits will be used, the last bit being a bit of determined parity by calculating the sum modulo 2 of the first m+r+1 bits. The used decoding matrix may be, according to the matrix M1m or M2m used for the coding, a matrix M"1m or a matrix M"2m (not shown), constructed based on matrixes M'1m or M'2m on the models of matrixes M"1 or M"2.

Figure 5A:
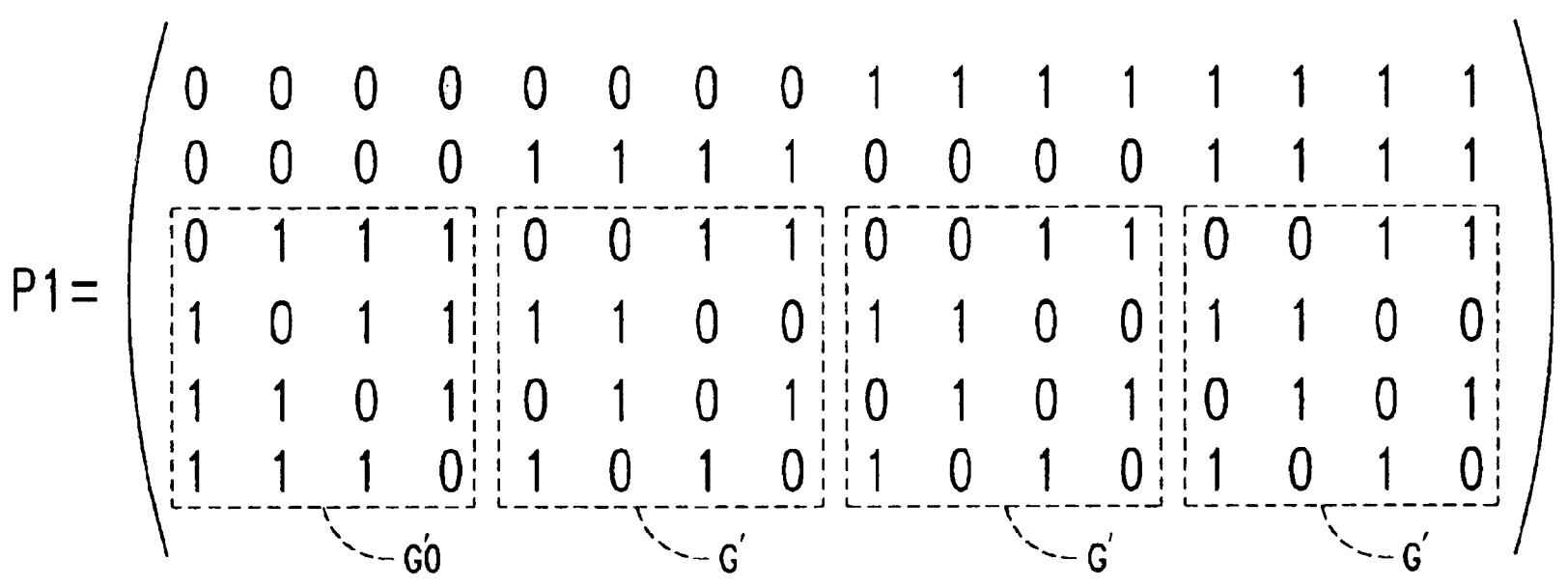
Figure 5B:
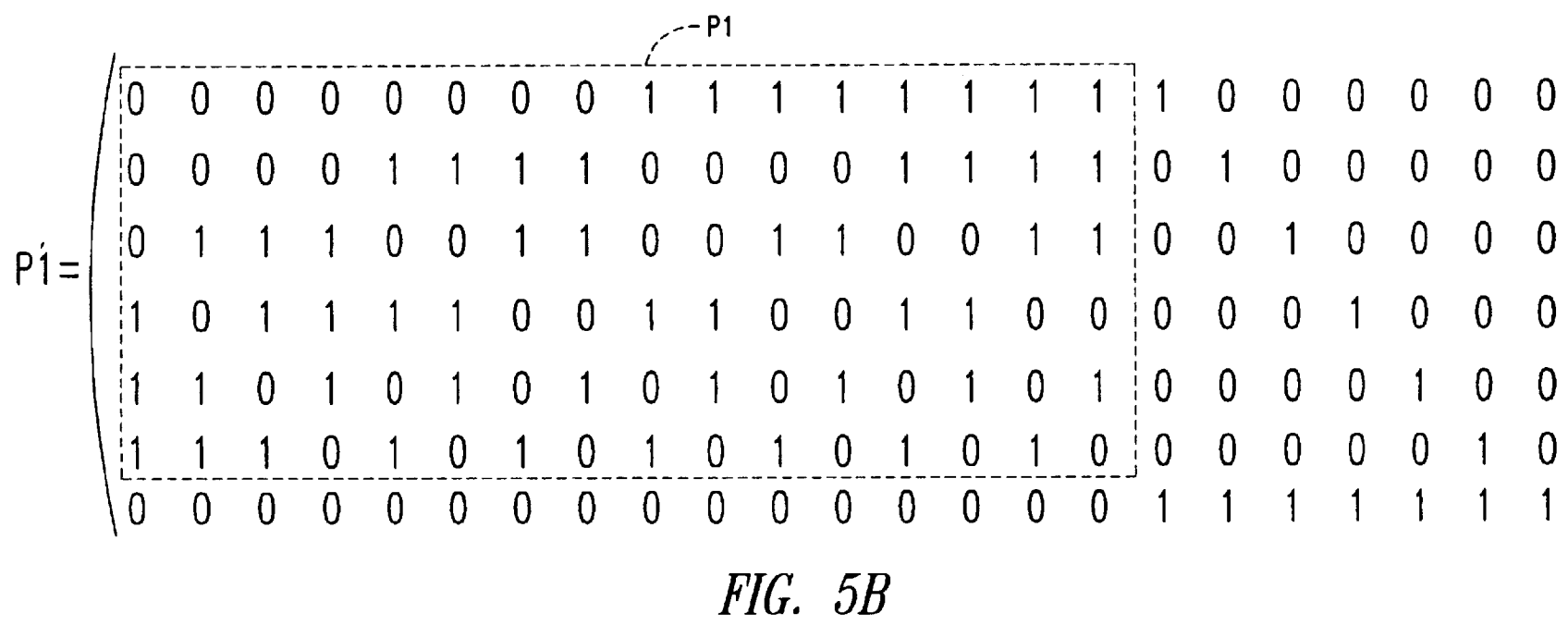

FIGS. 5A, 5B, and 6 illustrate a second embodiment of the present invention.

FIG. 5A illustrates a parity check matrix P1 for a 16-bit word to be coded. Matrix P1 is a matrix of dimensions 6×16.

The first 4×4 block located to the bottom left of matrix P1 is:

$$G'0 = \begin{pmatrix} 0111 \\ 1011 \\ 1101 \\ 1110 \end{pmatrix}.$$

Further, matrix P1 includes a repetitive pattern in the form:

$$G' = \begin{pmatrix} \bar{g}\bar{g}gg \\ gg\bar{g}\bar{g} \\ \bar{g}g\bar{g}g \\ g\bar{g}\bar{g}g \end{pmatrix},$$

with g=1, $\bar{g}$ being the complement to 1 of g. G' is a matrix chosen so that each column of matrix G' is different from another column of matrix G' and the sum modulo 2 of two of the columns of matrixes G' is never equal to one column of G'.

Matrixes G' and G'0 are sub-matrixes of matrix P1, and they will be so designated when necessary hereafter.

In matrix P1, matrix G' is present 3 times, one matrix G' following another to occupy the rest of the last four lines of matrix P1. The line just above matrixes G'0 and G' (second line of P1) is formed of a sequence of four "0s", followed by four "1s", followed again by four "0s" and by four "1s". The first line of P1 includes eight "0s", followed by eight "1s".

At the coding, six detection bits $C_0$ to $C_5$ are obtained by multiplying matrix P1 by the word to be coded. Detection bits $C_0$ to $C_5$ are added to the word to be coded. Further, a parity bit P is determined by adding modulo 2 the six detection bits.

At the decoding, a 7-bit syndrome is calculated by multiplying a matrix P'1 by a vector corresponding to a 23-bit word (16 data bits, added to 6 detection bits and one parity bit P).

FIG. 5B illustrates matrix P'1. Matrix P'1 is a matrix of dimension 7×23. Matrix P'1 first includes matrix P1, to the top left. As in the case of matrix M'1, the last line includes only "0s" under matrix P1 and "1s" elsewhere. The first six lines of columns 17 to 22 form a square block with "1s" on its diagonal and "0s" elsewhere, and the last column includes only "0s", except for the final "1".

The advantage of the second embodiment is the following. Indeed, all syndromes concerning data bits now include at least three "1s" and the configurations allowing a non-detection of two errors are no longer present. In this embodiment, any addition modulo 2 of any two syndromes provides a syndrome different from the syndromes that indicate an error in a data bit.

Accordingly, the code used in the second embodiment of the present invention enables, in addition to the detection and correction of one error in 100% of the cases, the detection of two errors also in 100% of the cases.

As for the first alternative of the first embodiment, the minimum code distance is equal to 4, and the code of the second embodiment can be designated by initials SEC-DED ("Single Error Correction-Double Error Correction"). The matrixes used in the second embodiment and in the first alternative of the first embodiment are of same dimension. As compared to the first embodiment, the coding of the second embodiment uses no second parity bit, which requires the presence of many addition circuits, all the data and detection bits having to be added.

FIG. 6 illustrates a matrix P2 providing the same advantages as matrix P1 and further making the decoding easier. Matrix P2 derives from matrix P1. To form matrix P2, matrix P1 is taken and the order of the columns of sub-matrix G'0 is first modified. After this modification, the column of G'0 of rank 0 is at rank 1, the column of rank 1 is at rank 3, the column of rank 3 is at rank 0, the column of rank 2 remaining at rank 2. Then, the second line of sub-matrixes G'0 and G', that is, the third line before the end of the matrix P1 so modified is displaced to form the first line of matrix P2, and the last line of matrix P1 (so modified) is displaced to form the second line of matrix P2, thereby pushing the former first and second lines of matrix P1, P2 and into the third and fourth lines of matrix P2 and also pushing the four to last and second to last lines of the modified matrix P1 to the fifth and sixth lines of the matrix P2.

It should be noted that the elements of the first line of matrix P2 represent, except for the first four columns, the complements to "1" of the elements of the last line but one of matrix P2, and that the elements of the second line of matrix P2 represent, except for the first four lines, the complements to "1" of the elements of the last line of matrix P2.

It should also be noted that, for matrix P2, as seen in FIG. 6, all syndromes indicate in a simple way, except for that concerning first bit $X_0$, the position of the defective bit.

It should also be noted that it is easy to generalize the coding according to the second embodiment of the present invention to words of more than 16 bits, taking as a model the generalization performed for the first embodiment.

It should also be noted that the method according to the present invention can be used to code or decode words of less than 16 bits. For example, for 8-bit words, matrix G alone will form the parity check matrix in the first embodiment of the present invention and, in the second embodiment of the present invention, the parity check matrix will be a 5×8 matrix including one sub-matrix G'0 and one sub-matrix G', an additional line including "0s" above sub-matrix G'0 and "1s" above sub-matrix G'.

Of course, the present invention is likely to have various alterations, modifications, and improvements which will readily occur to those skilled in the art. In particular, it should be noted that any permutation of lines or columns of the matrixes or sub-matrixes used in the present invention does not change at all the principle of the coding, and that codes using such matrixes or sub-matrixes are within the field of the present invention.

It should also be noted that circuits for implementing the provided codings and decodings are within the abilities of those skilled in the art, for example by means of "XORs", and have not been described furthering detail, although belonging to the field of the present invention. The invention can be implemented using a general purpose computer that includes a processor programmed to encode words received from an input device and store the encoded words in a memory. The computer may include another processor, or use the same processor used for encoding, to retrieve encoded words from the memory, decode them, and output the decoded words using an output device. Alternatively, the decoding processor can be remote from the encoding processor and connected by a network, such as the Internet. In that case, the encoded words are not necessarily stored and may simply be transmitted over the network to the decoding processor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. In a computer system, a method for determining r error detection bits of a word of m bits to be coded, comprising the step of calculating the product of a vector with m components representative of said word of m bits to be coded and of a parity check matrix, wherein the parity check matrix includes a pattern matrix that is different from the identity matrix and includes a plurality of columns, wherein said pattern matrix is chosen so that each column of said pattern matrix is different from another column of said pattern matrix and a sum modulo 2 of any two columns of said pattern matrix does not give as a result another column of said pattern matrix, wherein said pattern matrix is a matrix G such that:

$$G = \begin{pmatrix} 11110000 \\ 00001111 \\ 00110011 \\ 01010101 \end{pmatrix}.$$

2. The method of claim 1, wherein m is a multiple of 8 and the parity check matrix includes m/8 sub-matrixes each represented by the matrix G.

3. The method of claim 2, wherein elements of the sub-matrixes represent lower elements of the columns of the parity check matrix, wherein the parity check matrix includes one or more upper lines immediately above the sub-matrixes, and wherein, on the n-th line above the sub-matrixes, "0s" are present on the first $2^{n-1}$ sub-matrixes (G), "1s" are present on the $2^{n-1}$ next sub-matrixes, so that a number formed by the binary representation of the elements located above any column of a sub-matrix indicates a position of the considered sub-matrix in the panty check matrix.

4. The method of claim 3, wherein an upper line of the sub-matrixes is displaced to form a first line of the parity check matrix, whereby the last elements of any column of the parity check matrix are a binary representation of a position of said column.

5. In a computer system, a method for determining r error detection bits of a word of m bits to be coded, comprising the step of calculating the product of a vector with m components representative of said word of m bits to be coded and of a parity check matrix, wherein the parity check matrix includes a pattern matrix that is different from the identity matrix and includes a plurality of columns, wherein said pattern matrix is chosen so that each column of said pattern matrix is different from another column of said pattern matrix and a sum modulo 2 of any two columns of said pattern matrix does not give as a result another column of said pattern matrix, wherein said pattern matrix is a first sub-matrix G' such that:

$$G' = \begin{pmatrix} \bar{g}\bar{g}gg \\ gg\bar{g}\bar{g} \\ \bar{g}g\bar{g}g \\ g\bar{g}g\bar{g} \end{pmatrix},$$

g being a binary element and $\bar{g}$ being its complement.

6. The method of claim 5, wherein m is a multiple of 4, the first sub-matrix (G') being present [(m/4)−1]times, and the parity check matrix includes first four columns that include elements of a second sub-matrix (G'0) such that:

$$G'0 = \begin{pmatrix} 0111 \\ 1011 \\ 1100 \\ 1110 \end{pmatrix}.$$

7. The method of claim 6, wherein the elements of the first and second sub-matrixes represent lower elements of columns of the parity check matrix, and wherein the parity check matrix includes one or more upper lines of elements that are such that: on a line immediately above the first and second sub-matrixes, "0s" are present on said second sub-matrix G'0 and on even ones of said first sub-matrixes (G'), and "1s" are present on odd ones of said first sub-matrixes G'; and any subsequent ones of the upper lines, when they exist, being such that, on the n-th upper line above the first and second sub-matrixes, "0s" are present on the first and second sub-matrixes of rank 0 to $[2^{(n-1)}-1]$, "1s" are present on the $2^{n-1}$ next first sub-matrixes, so that a number formed by the binary representation of the elements located above any column of the first and second sub-matrixes indicates the position of the considered sub-matrix in the parity check matrix.

8. The method of claim 6, wherein the location of the columns of the second sub-matrix is modified so that, after modification, the column of rank 0 of the second sub-matrix is at rank 1, its column of rank 1 is at rank 3, its column of rank 3 is at rank 0, its column of rank 2 remaining at rank 2; the second line of the sub-matrixes, that is, the third line before the end of the parity check matrix, is displaced to form the first line of the panty check matrix, and the last line of the parity check matrix is displaced to form the second line of the parity check matrix, so that the lower elements of any column of the parity check matrix are the binary representation of the position of said column, except for the first column.

9. In a computer system, a method for determining a syndrome representative of possible errors that have occurred, during a processing, to a word of m+r+1 bits, the m+r+1 bits corresponding, before processing, to m bits of a word to be coded, r error detection bits calculating the product of a vector with m components representative of said word of m bits to be coded and of a parity check matrix, wherein the parity check matrix includes a pattern matrix that is different from the identity matrix and includes a plurality of columns, wherein said pattern matrix is chosen so that each column of said pattern matrix is different from another column of said pattern matrix and a sum modulo 2 of any two columns of said pattern matrix does not give as a result another column of said pattern matrix, and 1 parity bit obtained by calculating the sum modulo 2 of said r error detection bits, the method comprising multiplying a specific matrix by a vector having m+r+1 components representative of said m+r+1-bit word, wherein the specific matrix includes:

a) for the elements of the first r lines and the first columns, the elements of the parity check matrix having been used to determine the r error detection bits;
  b) for the last line, "0s" for the first m columns and "1s" after;
  c) for the first r lines and columns m+1 to m+r, a single "1" per column, shifted from line to line, the block formed by the first r lines and columns m+1 to m+r being in the form of a diagonal matrix; and
  d) for the last column, "0s" everywhere except on the last line.

10. In a computer system, a method for determining a syndrome representative of possible errors that have occurred, during a processing, to a word of m+r+2 bits, the m+r+2 bits corresponding, before processing, to m bits of a word to be coded, r error detection bits calculating the product of a vector with m components representative of said word of m bits to be coded and of a parity check matrix, wherein the parity check matrix includes a pattern matrix that is different from the identity matrix and includes a plurality of columns, wherein said pattern matrix is chosen so that each column of said pattern matrix is different from another column of said pattern matrix and a sum modulo 2 of any two columns of said pattern matrix does not give as a result another column of said pattern matrix, and first and second parity bits, the first parity bit being obtained by calculating the sum modulo 2 of said r error detection bits and the second parity bit being obtained by calculating the sum modulo 2 of said m bits of the word to be coded, of the r error detection bits, and of the first parity bit, the method comprising multiplying a specific matrix by a vector having m+r+2 components representative of said m+r+2-bit word, wherein said specific matrix includes:

a) for the elements of the first r lines and the first m columns, the elements of the parity check matrix having been used to determine the r error detection bits;
  b) for the next to last line, "0s" for the first m columns, "1s" for columns m+1 to m+r+1, and a "0" for the last column;
  c) for the last line, "1s" for all columns;
  d) for the first r lines and columns m+1 to m+r, a single "1" per column, shifted from line to line, the block formed by the first r lines and columns m+1 to m+r being in the form of a diagonal matrix;
  e) for the next to last columns, "0s" on the first r lines and "1s " on the last two lines; and
  f) for the last column, "0s" everywhere except on the last line.

11. In a computer system, a method for determining r error detection bits of a word of m bits to be coded, comprising the step of calculating the product of a vector with m components representative of said word of m bits to be coded and of a parity check matrix having a plurality of columns, wherein the parity check matrix includes a plurality of identical pattern matrixes that are different from the identity matrix and includes a plurality of columns, wherein said pattern matrix is chosen so that each column of said pattern matrix is different from another column of said pattern matrix and a sum modulo 2 of any two columns of said pattern matrix does not give as a result another column of said pattern matrix, wherein each column of the parity check matrix includes one of the columns of the pattern matrix, wherein m is a multiple of 8 and the parity check matrix includes m/8 sub-matrixes each represented by the matrix G.

12. The method of claim 11, wherein elements of the sub-matrixes represent lower elements of the columns of the panty check matrix, wherein the parity check matrix includes one or more upper lines immediately above the sub-matrixes, and wherein, on the n-th line above the sub-matrixes, "0s" are present on the first $2^{n-1}$ sub-matrixes (G), "1s" are present on the $2^{n-1}$ next sub-matrixes, so that a number formed by the binary representation of the elements located above any column of a sub-matrix indicates a position of the considered sub-matrix in the parity check matrix.

13. The method of claim 12, wherein an upper line of the sub-matrixes is displaced to form a first line of the parity check matrix, whereby the last elements of any column of the parity check matrix are a binary representation of a position of said column.

14. In a computer system, a method for determining r error detection bits of a word of m bits to be coded, comprising the step of calculating the product of a vector with m components representative of said word of m bits to be coded and of a parity check matrix having a plurality of columns, wherein the parity check matrix includes identical first and second pattern matrixes that are different from the identity matrix and each include a plurality of columns, wherein each pattern matrix is chosen so that each column of said pattern matrix is different from another column of said pattern matrix and a sum modulo 2 of any two columns of said pattern matrix does not give as a result another column of said pattern matrix, wherein each column of each pattern matrix is a first subset of a corresponding one of the columns of the parity check matrix, which also includes a second subset, the second subset of the parity check matrix columns corresponding to columns of the first pattern matrix being identical to one another, and the second subset of the rarity check matrix columns corresponding to columns of the second pattern matrix being identical to one another and different than the second subset of the parity check matrix columns corresponding to columns of the first pattern matrix, wherein m is a multiple of 8 and the parity check matrix includes m/8 sub-matrixes each represented by the matrix G.

15. The method of claim 14, wherein elements of the sub-matrixes represent lower elements of the columns of the parity check matrix, wherein the parity check matrix includes one or more upper lines immediately above the sub-matrixes, and wherein, on the n-th line above the sub-matrixes, "0s" are present on the first $2^{n-1}$ sub-matrixes (G), "1s" are present on the $2^{n-1}$ next sub-matrixes, so that a number formed by the binary representation of the elements located above any column of a sub-matrix indicates a position of the considered sub-matrix in the parity check matrix.

16. The method of claim 15, wherein an upper line of the sub-matrixes is displaced to form a first line of the parity check matrix, whereby the last elements of any column of the parity check matrix are a binary representation of a position of said column.

* * * * *

UNITED STATES PATENT AND TRADEMARK OFFICE
CERTIFICATE OF CORRECTION

PATENT NO. : 6,961,891 B2
DATED : November 1, 2005
INVENTOR(S) : Laurent Murillo It is certified that error appears in the above-identified patent and that said Letters Patent is hereby corrected as shown below:

<u>Column 13,</u>
Line 18, "panty check matrix," should read -- parity check matrix, --.
Line 43, "first columns," should read -- first m columns, --.

<u>Column 15,</u>
Line 12, "rarity check matrix" should read -- parity check matrix --.

Signed and Sealed this

Fourth Day of April, 2006

JON W. DUDAS
*Director of the United States Patent and Trademark Office*